(12) United States Patent
Herbert

(10) Patent No.: US 6,981,878 B1
(45) Date of Patent: Jan. 3, 2006

(54) CONNECTION SYSTEM FOR FAST POWER SUPPLIES

(76) Inventor: Edward Herbert, 1 Dyer Cemetery Rd., Canton, CT (US) 06019-2029

( * ) Notice: Subject to any disclaimer, the term of this patent is extended or adjusted under 35 U.S.C. 154(b) by 0 days.

(21) Appl. No.: 10/906,165

(22) Filed: Feb. 4, 2005

Related U.S. Application Data

(60) Provisional application No. 60/522,952, filed on Nov. 24, 2004, provisional application No. 60/521,031, filed on Feb. 7, 2004.

(51) Int. Cl.
  *H01R 12/00* (2006.01)
(52) U.S. Cl. .......................................... 439/65; 439/67
(58) Field of Classification Search ................. 439/65, 439/55, 68–69, 74, 44
  See application file for complete search history.

(56) References Cited

U.S. PATENT DOCUMENTS 3,474,379 A * 10/1969 Masi et al. .................... 439/74
5,219,292 A * 6/1993 Dickirson et al. ............ 439/67
5,894,411 A * 4/1999 Embo et al. ................. 361/774
6,699,395 B1 * 3/2004 Svenkeson et al. ........... 216/13
6,926,561 B1 * 8/2005 Handforth et al. ........... 439/632

* cited by examiner

*Primary Examiner*—Michael C. Zarroli

(57) ABSTRACT

In a low voltage, high current power supply having very fast transitions of the load current, as in certain power supplies for microprocessors, the circuit impedances, particularly the stray inductance of the connector, are a major problem. If the voltage regulator circuits are separated from the output capacitor and brought to separate contacts in the connector, only connecting together on the load side, the voltage regulator will be much better able to overcome the connector impedance. The connector may be a printed connector, in which the metal surfaces of the internal layers of a multi-layer printed circuit card are extended successively and mate with a similar complementary printed connector. To overcome high frequency effects, the power bus is a multilayer interleaved bus. Vias conduct the high frequency component of the current much more effectively at the edge of a stack of foil layers, so the power bus is strongly digitated to increase the periphery.

9 Claims, 10 Drawing Sheets

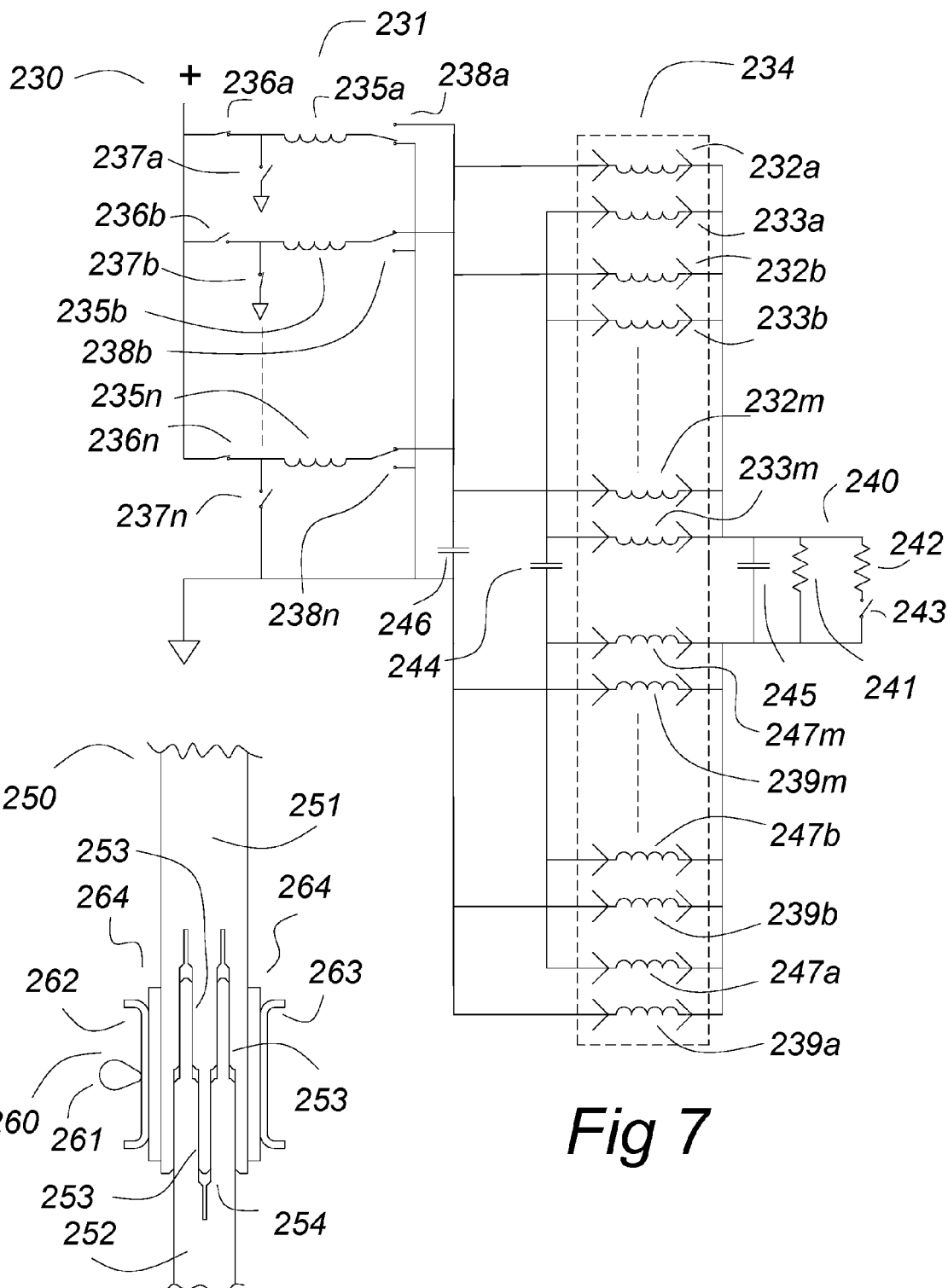

CONNECTION SYSTEM FOR FAST POWER SUPPLIES

CROSS REFERENCE TO RELATED APPLICATIONS

This application is a continuation in part application of a provisional patent application Ser. No. 60/521,031 entitled "Connector with Current Injection", filed 7 Feb., 2004.

This application is also a continuation in part application of a provisional patent application Ser. No. 60/522,952, entitled "Connection System for Fast Power Converters", filed 24 Nov., 2004.

Priority to those dates is claimed.

BACKGROUND OF THE INVENTION

In a fast power supply that must provide low voltage, high current power with very fast current transitions and tight regulation, the inductance of the connection system is a serious problem. To drive fast transitions of current through the inductance of the connector requires a significant voltage across the connector, but that is incompatible with holding tight voltage regulation.

Often a fairly large capacitor is used on the output of the power supply. One function of this capacitor is to reduce the ripple voltage. Another is to provide a low impedance source for dynamic changes in the output current. However, the large output capacitor also suppresses the voltage that might drive fast current transitions through the connection system.

SUMMARY OF THE INVENTION

This invention teaches that the output capacitor of a fast power supply can be separated from the fast power supply but can be connected to it and the load through separate pins of the connector. The outputs of power supplies often have characteristics of controlled current sources, so there is ample voltage to drive the current through the connector to the load. The output capacitor can be placed on the power supply board, but it is connected to the load through separate pins so that it does not attenuate the driving voltage for the current transition.

This invention teaches that an interleaved multilayer circuit board can provide a very low impedance connection system for a fast power supply. Several layers of the multi-layer board are arranged in pairs having counter-flowing currents, to minimize the inductance.

This invention teaches using a number of layers of the multilayer board for current conduction because at very high frequencies, the penetration depth into the conductor of the very high frequency current is very small. It is taught to use multiple layers of wide conductors to that the total cross-sectional area available for conduction of the very high frequency current is sufficient.

This invention teaches that the multiple layers of wide conductors may extend to the edge of a circuit board, some extending further than others and all having an exposed area of uninsulated metal for connection with complementary exposed areas of uninsulated metal of a mating circuit board to comprise a connector.

This invention also teaches that pairs of conductors with counter-flowing current are preferably closely spaced with a dielectric film between them. It is preferred to use adjacent extended exposed uninsulated metal areas to connect pairs of conductors with their continuation on a second circuit board so that the spacing through the dielectric layer is consistent across the connector, to minimize impedance discontinuities at the connector.

This invention teaches that conventional vias are not adequate to carry very high frequency currents to buried layers of a multilayer circuit board. To be effective, the vias have to be at the edge of a stack of conductors. Accordingly, it is taught to interdigitate the conductors and to locate the vias on the edges of the interdigitated conductors.

This invention also teaches that alternate interdigitated conductors may connect to the output of the fast power supply and to the output capacitor and that the interdigitated conductors may extend to a connector, separately, and that they may be connected at the load side of the connector.

This invention also teaches that the interdigitated conductors may taper toward their ends so that the is not an abrupt ending of the conductor from which reflections could be reflected back, perhaps causing standing waves in the power bus.

BRIEF DESCRIPTION OF THE DRAWINGS

FIG. 7 shows that the separate connections to a load are preferably through a plurality of parallel connector contacts. FIG. 7 also shows that a portion of the output capacitance may be conventionally connected.

FIG. 8 shows an edge view of a connector of this invention having a plurality of extended exposed metal areas that are in registration with complementary extended exposed metal areas of a mating circuit. A clamp ensures a tight connection.

DETAILED DESCRIPTION

Figure 1:
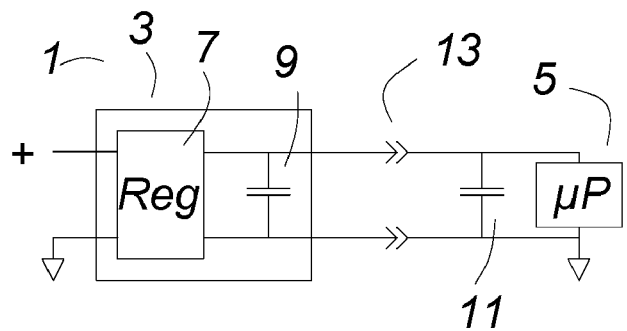
FIG. 1 shows a prior art power supply having an output capacitor that is connected to a load. The load is a microprocessor, as an example, not a limitation.

FIG. 1 shows a power supply system 1 comprising a power supply 3 connected through a connector 13 to an output load 5 shown as a microprocessor. There will likely be one or more decoupling capacitors 11 near the load. The power supply 3 comprises a power converter 7 shown as a voltage regulator as an illustration, not a limitation, and an output capacitor 9. The voltage regulator 7 may be a buck regulator, as an example.

In this specification and the claims, a "power supply" is an assembly for providing power to a load. It is usually, but not necessarily, connected to the load through two or more contacts of a connector so that the power supply is a separate assembly and can be separated from the load by unplugging the connector. A power supply usually comprises a "power converter" and an "output capacitor". In this specification and the claims, a "power converter" is a source of current, and may be either a voltage regulator or a controlled current source. Recitation of a "power converter" includes a voltage regulator, a controlled current source, or any other source of current that can be controlled to regulate voltage or current or both. The power converter will have at least two electrical output terminations, at least one positive output termination and at least one negative output termination.

In this specification and the claims, an "output capacitor" is a relatively large capacitor usually (but not necessarily) located near the power converter in the power supply, for smoothing the output ripple and storing energy. The output capacitor will have two or more electrical terminations, at least one positive output capacitor termination and at least one negative output capacitor termination. Because this invention relates to the way in which the power converter and the output capacitor are connected to each other and the load, they are defined separately. While a power converter may contain some capacitors for filtering, transient suppression, control or whatever, these capacitors are generally smaller than the output capacitor, and one skilled in the art of power supplies would distinguish between them readily in view of this definition and explanation.

In this specification and the claims, a "load" is a user of electrical power, in particular, a user of electrical power from the power supply. The load is usually, though not necessarily, connected to the power supply through a connector. The load will have at least two terminations, at least one positive load termination and at least one negative load termination. In some applications the load may momentarily be a source of electrical power and the power supply may sink the electrical power from the load.

In this specification and the claims, a "connection system" comprises a first connector and a second connector, the first and second connectors each having a plurality of electrical contacts which are complementary, that is, they will mate one to the other to comprise a plurality of electrical connections through the connection system. As an example, a first connector may be on a power supply and a second connector may be on a load. When the first connector is connected to the second connector, power may flow from the power supply to the load. In this detailed description, a connection system may be called a "connector", and it is understood from the syntax that the connector comprises complementary mating first and second connectors.

Figure 2:
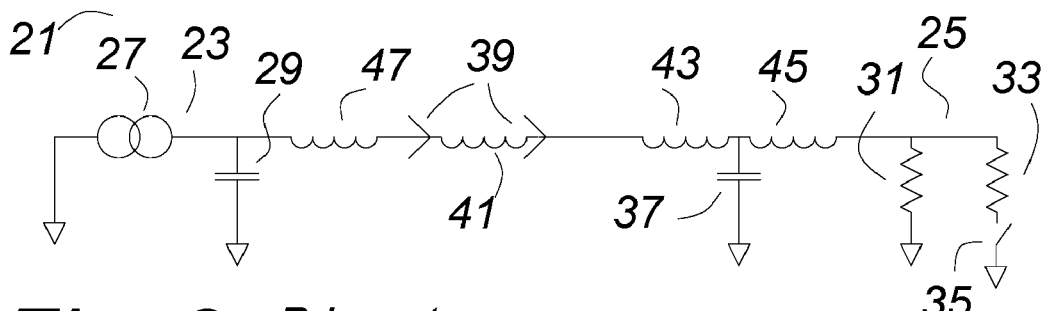
FIG. 2 shows an equivalent circuit of the power supply and load of FIG. 1. The stray inductances are emphasized.

FIG. 2 shows an equivalent circuit 21 of the power supply system 1 of FIG. 1. A power supply 23 comprises a controlled current source 27 and an output capacitor 29. A stray inductance 47 is also shown. The power supply 23 is connected to a load 25 through a connector 39. The load 25 is shown as two resistors 31 and 33, and a switch 35 may switch the resistor 33 in and out of the circuit. The load of the resistor 31 represents the minimum load for the power supply 23, and the parallel combination of the resistors 31 and 33 represent the maximum load. A practical power supply will likely accommodate any load between the minimum load and the maximum load, but this schematic shows the maximum possible step change of output current for normal operating conditions. The output load may have one or more decoupling capacitors 37. Stray inductances 43 and 45 of the load are shown, as is the stray inductance 41 of the connector 39. Although not shown, it is understood that there will be one or more sets of contacts in the connector 39 for the ground return as well.

Some power supply loads have very fast load current transitions, a microprocessor being an example. A microprocessor is capable of going from an idle current to full load in a few machine cycles, and back to idle current just as fast. Present power supplies cannot change current that quickly, so the microprocessor has the constraint of having to limit the rate of change of its input current. A representative microprocessor may have a voltage in the order of one volt and a full load current in excess of 100 amperes. A representative idle current may be in the order of 30 percent, or 30 amperes. The rate of load change may be constrained to one hundred amperes per microsecond, though it would be desirable to permit much faster transitions in current.

Many power supplies have characteristics of a controlled current source, because their regulating source is an inductor with a pulse width modulated (pwm) source voltage. One of the limitations of such a power supply is the rate at which the current can be increased in the output inductor. A new generation of power supply may avoid that limitation, but even with an ideal power supply, the problem of the output capacitor and the stray inductances makes it difficult or impossible to maintain output voltage regulation at the load with fast changes in the load current. Of particular concern is the stray inductance 41 of the connector 39.

The problem of the stray inductance 41 of the connector 39 is exacerbated by the attenuating effect of the output capacitor 29. Even if the controlled current source 27 is capable of a step change of current from minimum to maximum load, the current first must flow into the output capacitor 29. As the voltage in the output capacitor 29 cannot change instantly, the voltage of the capacitor ramps up slowly. Meanwhile, the increased load current is dropping the voltage of the decoupling capacitor 37, causing a negative spike in the output voltage. The current can only increase through the stray inductances 47, 41 and 43 when there is sufficient voltage difference between the output capacitor 29 and the decoupling capacitor 37 to over come the stray inductances 47, 41 and 43.

Figure 3:
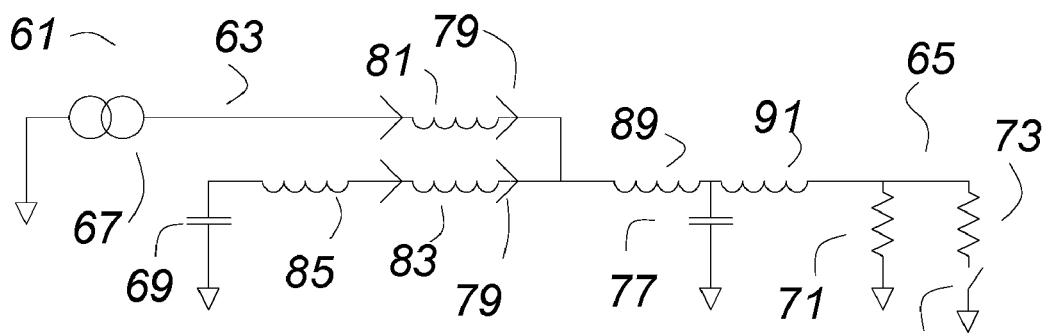
FIG. 3 shows a current injection connector of this invention. The power supply is connected to a load circuit through one connector circuit and the output capacitor is connected through another connector circuit.

FIG. 3 shows a power supply system 61 that overcomes many of these problems. As in FIG. 2, a power supply 63 provides an output current to a load 65 through a connector 79. The load is shown as two resistors 71 and 73 with a switch 75. The power supply 63 comprises a controlled current source 67 and an output capacitor 69, and the load 65 may have one or more decoupling capacitors 77. Stray inductances 81, 83, 89 and 91 are also shown in FIG. 3. Note, however, that the output capacitor 69 is connected to the power supply system 61 through separate pins in the connector 79. Although not shown, it is understood that there will be one or more sets of contacts for the ground return as well.

If the voltage regulation of the power supply 63 has the characteristics of a controlled current source 67, then there will be a sufficient driving voltage at its output to drive a fast transition of current through the connector 79, even with its stray inductance 81. The attenuating effect of the output capacitor 69 is not a factor in this conduction path, as the output capacitor 69 is connected to the power supply system 61 through separate pins of the connector 79.

Ideally, the output current of the power supply 63 equals the current of the load 65, so ideally no current would flow into or out of the output capacitor 69. Practically, there is some lag in the control of the power supply 63, so some current flows out of the output capacitor 69 when the load is increased and the charge that is removed from the output capacitor 69 by this initial current must then be restored.

FIGS. 4a through 4f show a representative power supply interconnection system 100 of this invention wherein a power supply circuit 101 provides power to a load circuit 115, which may be a microprocessor (not shown), as an example, not a limitation. On the load circuit 115, power is provided from the power supply 101 through a connector 117. The connector 117 is shown as a standard printed circuit edge connector having a power connection 119 on the top of the load circuit 115 printed wiring board and having a return connection 121 on the bottom of the printed wiring board.

The power supply circuit 101 has a connector 103 which mates with the connector 117 of the load circuit 115. When the connectors 103 and 117 are mated, a plurality of power connection contacts 123—123, 125—125 make electrical contact with the power connection 119 on the top of the load circuit 115 printed wiring board. On the bottom, a return connection area 113 makes contact with the return connection 121 of the load circuit 115. There may also be some extra connector contacts 111 for ancillary use, such as for monitoring and control.

Of the plurality of power connection contacts 123—123, 125—125, alternate contacts can be seen to be designated "I" (123—123) or "C" (125—125), and it should be understood that the contacts designated "I" (123—123) are connected to the voltage regulation circuit (not shown) of the power supply circuit 101, whereas the contacts designated "C" (125—125) are connected to an output capacitor (not shown), and the output capacitor is connected to the voltage regulation circuit only when the power supply 101 is connected to the load circuit 115, and that connection is through different contacts in the connector.

Figures 4A, 4B:
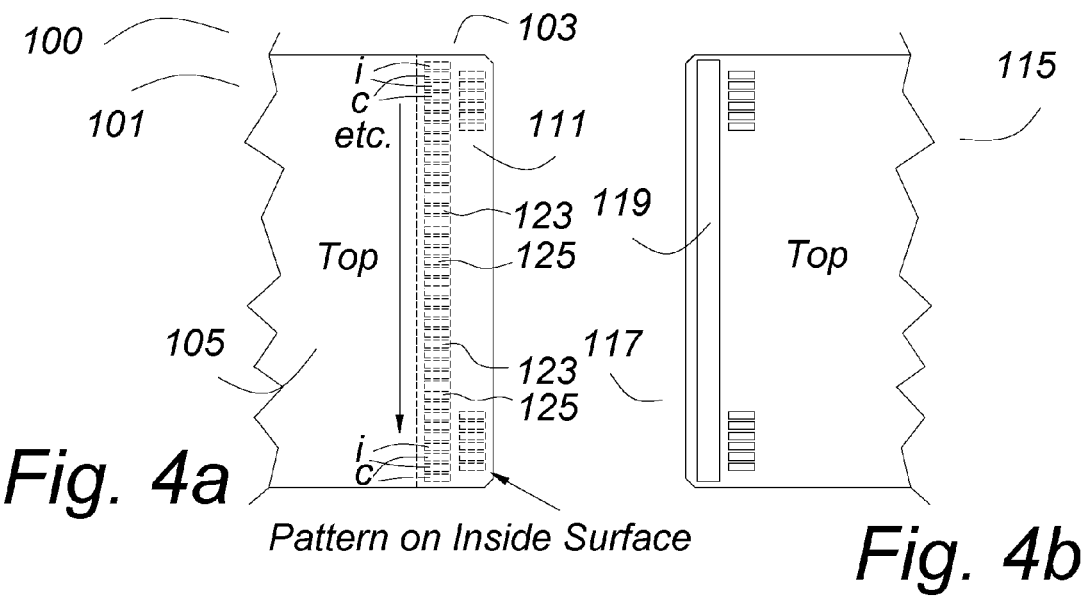
FIGS. 4a through 4f show the top, edge and bottom of a mating pair of circuit boards. On the right is a representative microprocessor circuit board as an example, not a limitation. On the left is a connection system of this invention.
Figures 4C, 4D:
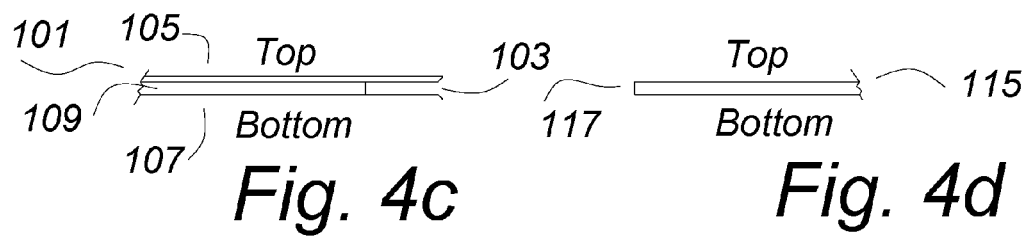
Figures 4E, 4F:
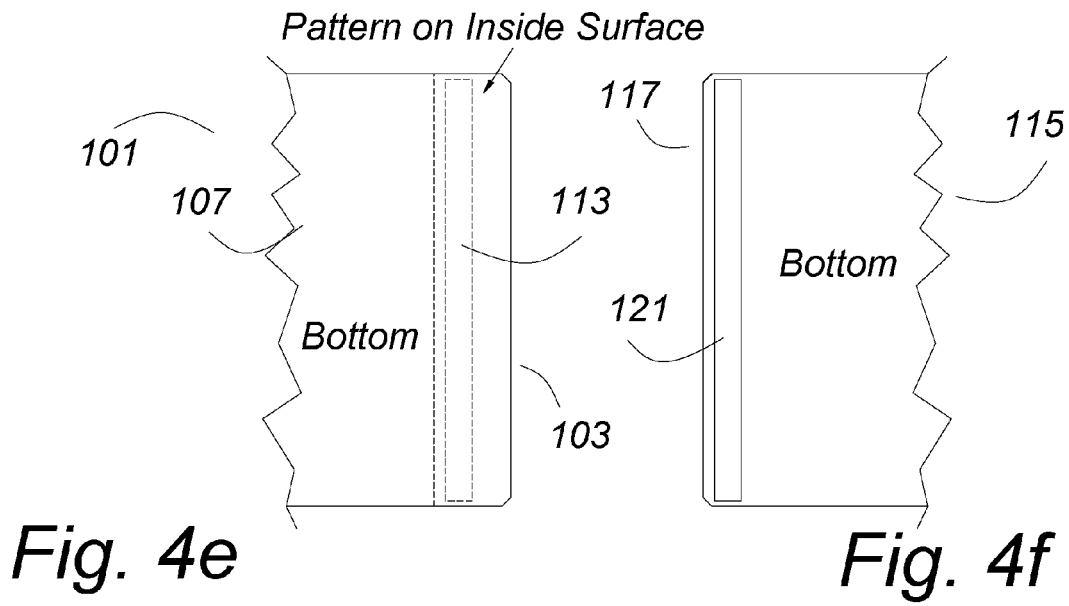

FIGS. 4a, 4c and 4e show the connector 103 of the power supply circuit 101 as being plated on the inside surfaces of extended outer layers 105 and 107 of the printed wiring board on which the power supply circuit 101 is assembled. This construction is preferred as it has a lower leakage inductance than the prior art molded printed circuit connectors, however the teaching of this invention to use different contacts for the voltage regulator and the output capacitor is equally applicable to prior art molded printed circuit connectors. To provide proper spacing so that the connector 117 of the load circuit 115 is a slip fit into the connector 103 of the power supply circuit 101, a spacer laminate 109 is sandwiched between the top layer 105 and the bottom layer 107 of the power supply circuit 101. The spacer laminate 109 may comprise internal layers of a multilayer printed circuit board. The connectors 103 and 117 are preferably clamped tightly together with a clamp (not shown) to ensure a good electrical connection.

Figure 5:
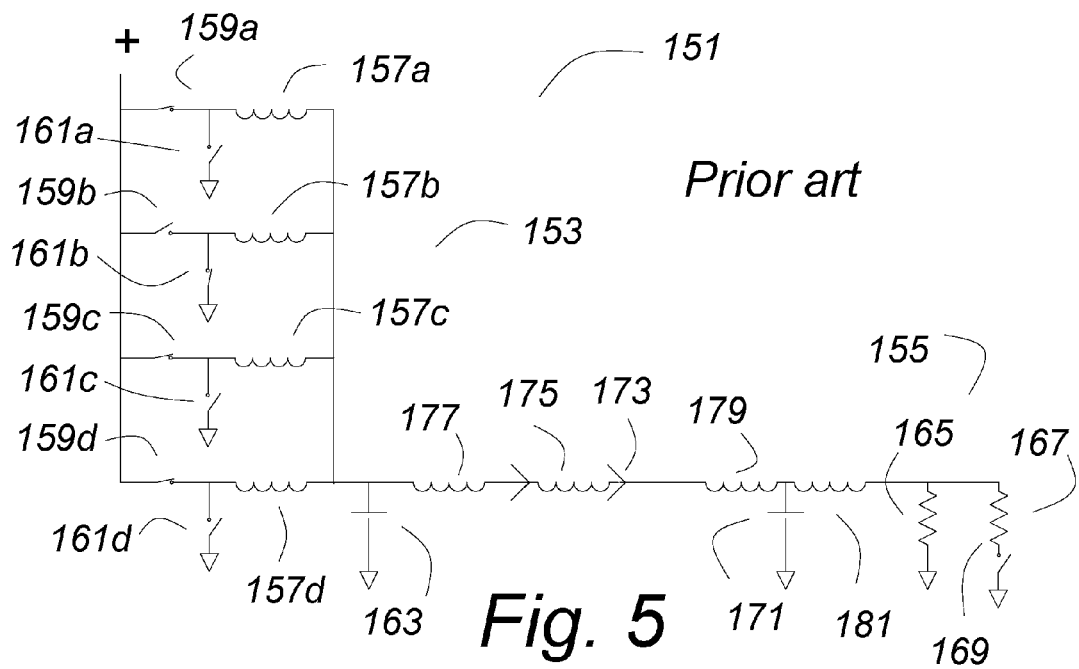
FIG. 5 shows a prior art multiphase buck converter power supply having an output capacitor conventionally connected to a load.

FIG. 5 shows a prior art power supply system 151 comprising a multiphase buck converter 153 connected to a load 155 through a connector 173. The multiphase buck converter 153 comprises four supply switches 159a–159d, four return switches 161a–161d and four inductors 157a–157d connected to an output capacitor 163. The load 155 comprises two resistors 165 and 167, one of which 167 has a switch 169 so that the load 155 may be maximum or minimum. Usually a power supply load could be any value between the maximum and the minimum load, but this arrangement is shows as an illustration only to represent the maximum possible load current transient condition. The output load 155 may have one or more decoupling capacitors 171. Stray inductances 177, 175, 179 and 181 are also shown. As in FIG. 2, the output capacitor 163 attenuates the output voltage resulting from a current change in the inductors 157a–157d so that there is very little driving voltage to drive a change in current through the stray inductances 177, 175, 179 and 181, particularly the stray inductance 175 of the connector 173. Although not shown, it is understood that there will be one or more sets of contacts for the ground return as well.

Figure 6:
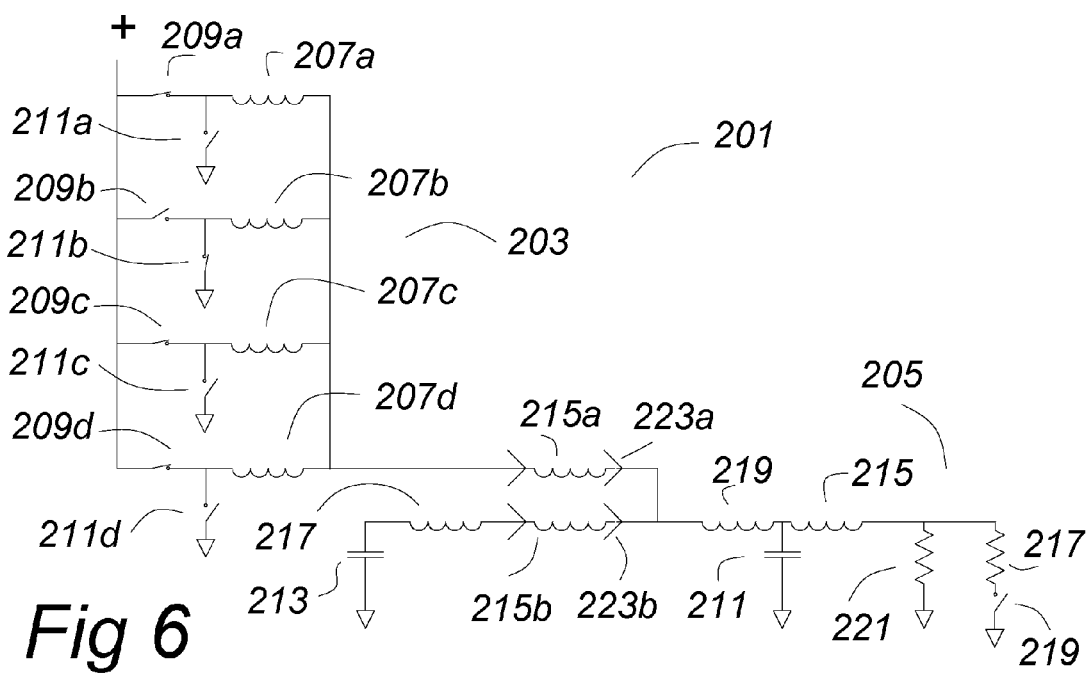
FIG. 6 shows the multiphase buck converter power supply of FIG. 5 with the output capacitor separately connected to the load.

FIG. 6 shows a power supply system 201 of this invention. A multiphase buck converter 203 is connected to a load 205 through a connector 223a–223b. Leakage inductances 215a, 215b, 217, 219 and 215 are shown. The multiphase buck converter 203 comprises four supply switches 209a–209d and four return switches 211a–211d driving four inductors 207a–207d. The load 205 comprises two resistors 221 and 217, and a switch 219 can switch the resistor 217. Usually a power supply load could be any value between the maximum and the minimum load, but this arrangement is shows as an illustration only to represent the maximum possible load current transient condition. The load 205 may have one or more decoupling capacitors 211.

In contrast to the power supply system 151 of FIG. 5, the output of the four inductors 207a–207d and an output capacitor 213 are connected to the load 205 through separate contacts of the connector, 223a and 223b respectively. The outputs of the four inductors 207a–207d will have sufficient drive potential to overcome the inductance 215a of the connector contact 223a, as the drive potential will not be attenuated by the output capacitor 213. Although not shown, it is understood that there will be one or more sets of contacts for the ground return as well.

FIG. 7 shows a power supply system 230 of this invention. A switched current power converter 231 is connected through a connector 234 to a load 240. The switched current power converter 231 comprises an indefinite integer n of inductors 235a–235n. N supply side switches 236a–236n and n return switches 237a–237n are operated by a controller circuit (not shown) such that the currents in the n inductors 235a–235n are regulated in a "constant current" mode. The current from the n inductors 235a–235n is directed to the load 240 when any of the n load side switches 238a–238n is closed to the load 240, and it is directed to the return when any of the n load side switches 238a–238n is closed to the return.

The load 240 is shown as two resistors 241 and 242, and a switch 243 can switch the resistor 242 in and out of the load 240. Usually a power supply load could be any value between the maximum and the minimum load, but this arrangement is shows as an illustration only to represent the maximum possible load current transient condition. The load 240 may have one or more decoupling capacitors 245.

The connector 234 comprises an indefinite integer m of pairs of contacts 232a–232m and 233a–233m on the "high side", and m pairs of contacts 239a–239m and 247a–247m on the "return side". The high side of the switched current power converter 231 is connected to the load 240 through the m contacts 232a–232m, and its return is connected through the m contacts 239a–239m. The high side of an output capacitor 244 is connected to the load 240 through the m contacts 233a–233m, and its return is through the m contacts 247a–247m. Although the number of contacts in each group is shown as being equal to the indefinite integer m, as an illustration, this is the preferred arrangement and not a limitation, as it is not necessary for them to be equal. Also, there will very likely be additional contacts in the connector 234 for monitoring, control and so forth.

The contacts 232a–232m, 233a–233m, 239a–239m and 247a–247m are all shown with representative leakage inductance, representing that the leakage inductances of the contacts of the connector 234 are a serious problem in a power supply system in which there are very fast transitions of current. Note in particular that all of the high side contacts are brought to a common connection on the load side of the connector 234, as are all of the returns, but connections to the power converter 231 and the connections to the output capacitor 244 are separated on the power supply side of the connector 234.

Because the n load side switches 238a–238n can switch nearly instantaneously, there can be extremely fast transitions in the current to the load 240. The currents in the inductors 235a–235n will have the characteristics of current sources, and will have sufficient potential to drive the current transition through the leakage inductance of the connector contacts 232a–232m and the return contacts 239a–239m. It may be desirable to use a small decoupling capacitor 246 to limit spiking on this node, and it is contemplated that the decoupling capacitor 246 would be of the same order of magnitude as the load decoupling capacitor 245 and that both would be small compared to the output capacitor 244, as and illustration and a preferred embodiment, not a limitation.

FIG. 8 shows a section through a connection system comprising a multilayer printed connector 250. The connector 250 connects two multilayer printed wiring boards 251 and 252. The details of construction for a multilayer printed connector are described in greater detail below. In the example of the connector 250 of FIG. 8, eight layers of the printed wiring boards 251 and 252 make metal-to-metal contact at areas of complimentary exposed conductor surfaces 253—253. There may be slots 254 extending from the contact area to give the circuit boards 251 and 252 greater resiliency in the area of the connector 250 so that a clamp 260 may compress the connector area tightly, to make a tight connection in all of the layers of the connector 250. As an example, not a limitation, the clamp 260 may comprise a cam 261, a moveable plate 262, a fixed plate 263 (relative to the axis of rotation of the cam 261) and resilient pads 264, 264. Any means for clamping the circuit boards 251 and 252 over the connector 250 would suffice.

Figure 9:
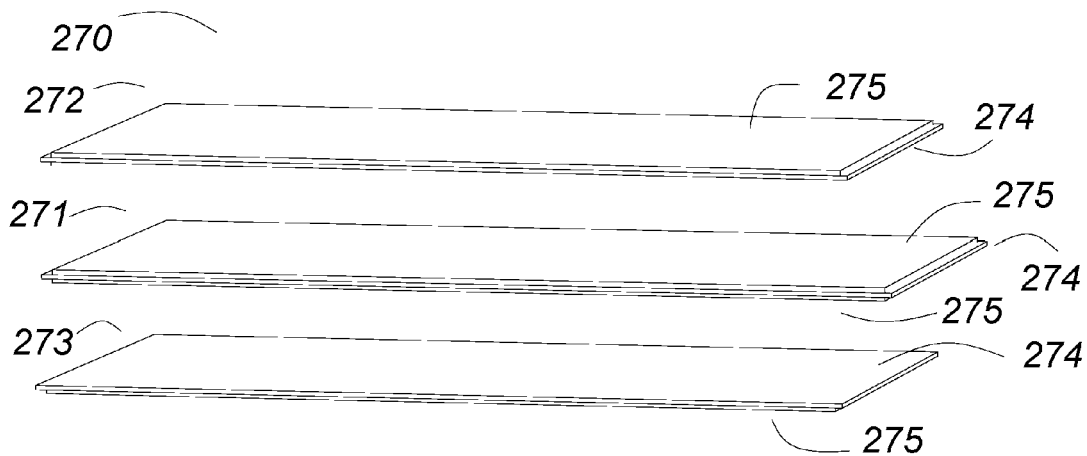
FIG. 9 shows representative metal and insulator laminates from which circuit boards having a connection system of this invention may be fabricated.

FIG. 9 shows a possible subassembly 270 for a printed wiring board having a printed connector. A first laminated layer 271 comprises an insulating substrate 274 having copper foil 275, 275 bonded to its top and bottom surface. The copper foil may be "printed" in the usual manner of fabricating printed circuit boards, as by etching and plating. A second laminated layer 272 comprises an insulating substrate 274 with copper foil 275 bonded to its top surface, and a third laminated layer 273 comprises an insulating substrate 274 with copper foil 275 bonded to its bottom surface.

Figure 10:
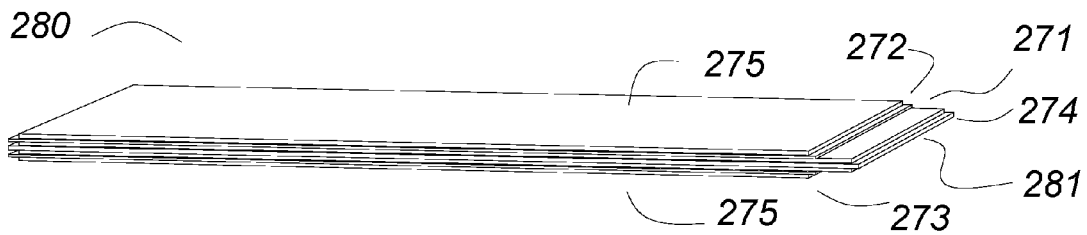
FIG. 10 shows the metal and insulator laminates of FIG. 9 laminated into a circuit subassembly with extended uninsulated exposed metal surfaces, for making a connection to another circuit.

FIG. 10 shows the laminates 271, 272 and 273 bonded together to make a printed wiring board subassembly 280. The first laminated layer 271 extends beyond the second and third laminated layers 272 and 273 to comprise a printed connector 281. Because the first laminated layer 271 extends beyond the second and third laminated layers 272 and 273, there is a strip of exposed copper on both sides, and the copper foils 275, 275 of the second and third laminated layers 272 and 273 are also exposed.

Figure 11:
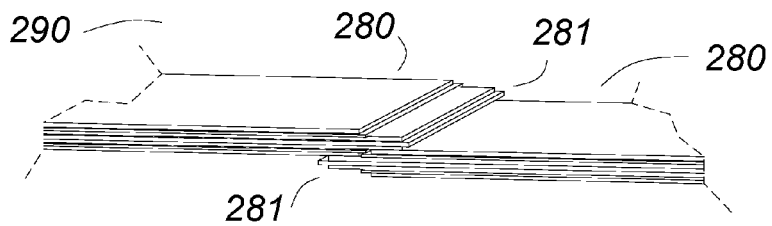
FIG. 11 shows two of the circuit subassemblies of FIG. 10 with some of their respective extended uninsulated exposed metal surfaces in contact, to make a connection.

FIG. 11 shows a printed connector 290 comprising two of the printed wiring board subassemblies 280, 280 making a nested contact in the areas of their respective printed connectors 281, 281. Where there is metal to metal contact, current can flow through the connectors 281, 281.

Figure 12:
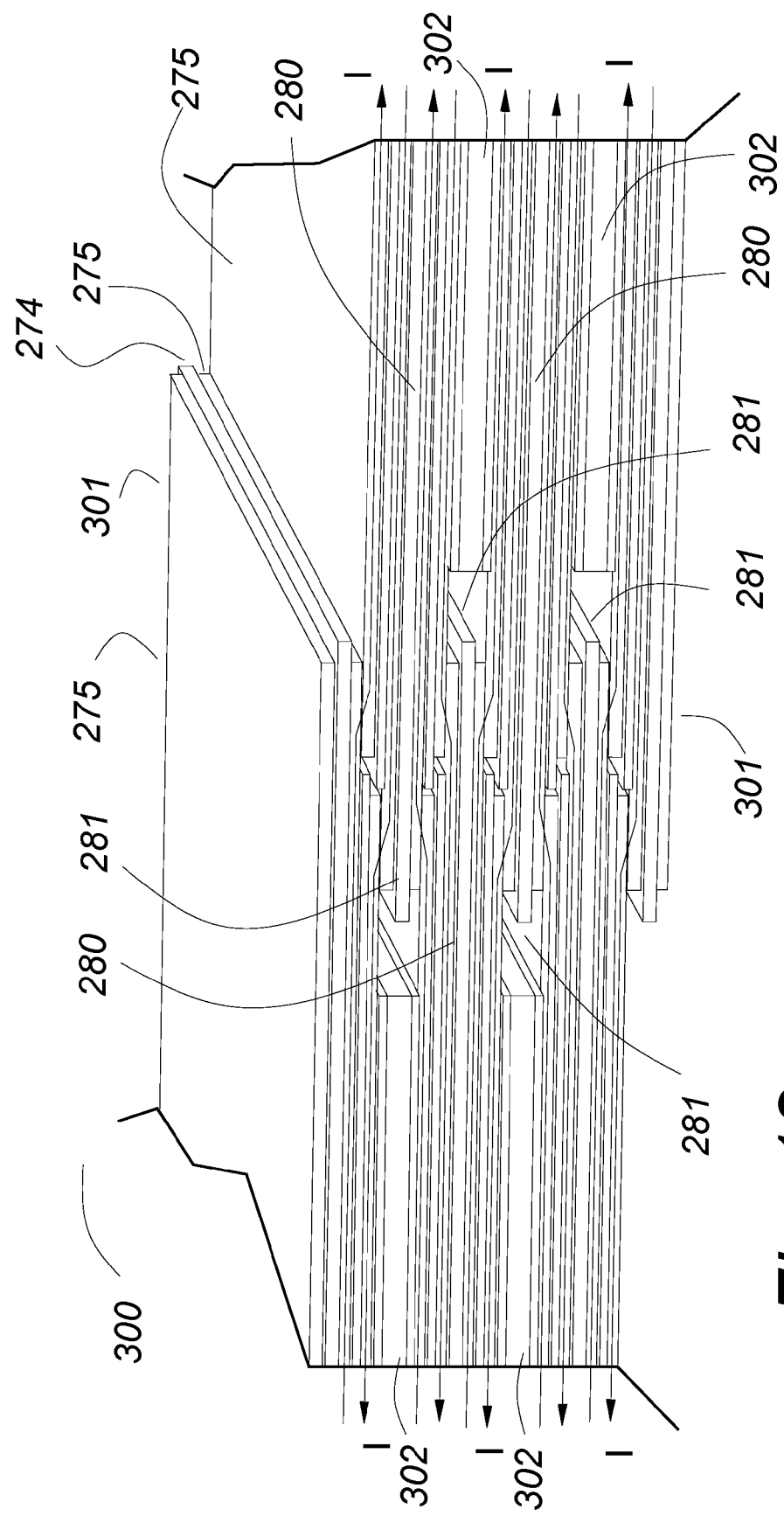
FIG. 12 shows a stack of the circuit subassemblies of FIG. 10 in exaggerated scale mated with a complimentary stack of similar circuit subassemblies. Except for the outer layers, all of the extended uninsulated exposed metal surfaces connect with a complimentary extended uninsulated exposed metal surface. Arrows show representative current flow through the connector.

FIG. 12 shows a printed connector 300 comprising a plurality of the subassemblies 280 of FIG. 10 in a nested interleaved arrangement so that contacts may be made between multiple internal layers of the resulting printed wiring boards. The exact arrangement of the several layers of the multilayer board will vary from application to application, and the various figures show examples, not limitations. There may be more or fewer layers overlapping, and the layers may be varied appropriately. As an example, not a limitation, the outer laminated subassemblies 301, 301 have fewer layers than the internal laminated subassemblies 280—280. To provide clearance so that the connector areas 281—281 are a slip fit one to another, spacer laminated layers 302—302 are used between the subassemblies 280—280 and 301, 301. These spacer laminated layers may be multilayer copper and insulating layers as well, as a printed wiring board likely will need runs and vias in addition to those going to the connector 300.

In FIG. 12, ten copper foils 275—275 make contact with ten complementary copper foils on the other side of the connector 300. In addition, the outer surface of both sides may also have copper foils 275, 275 which may be printed with a suitable pattern for mounting components thereon in the usual manner of printed wiring board fabrication. Ten arrows labeled I show the current paths through the connector 300. Note that the current may flow in five pairs of closely spaced layers with a fairly even dielectric spacing between them, even in the area where they pass through the connector. Thus there will be little discontinuity in the impedance of the circuits through the connector. Further, the distributed capacitance will be significant, and the distributed capacitance will have essentially no esl. The power buss may have characteristics of a transmission line, and reflections or standing waves would be undesirable.

FIGS. 9 through 12 show the copper foils 275—275 extending the full width of the laminated layers. While it is entirely possible to use the connector with full width contacts, it is contemplated that the copper foils 275—275 would be printed in the manner of printing a printed wiring board with a pattern of conductors with insulating spaces between them and that they would interconnect within the finished printed wiring board to make a plurality of contacts on each layer.

In FIGS. 9 through 12, the scale is exaggerated to better show the construction of the printed connector. In actuality, the several layers of the printed wiring boards are very thin so when the whole is stacked with prepreg and bonded, the whole assembly is also thin. The finished assemblies may be as shown in FIG. 13.

Figure 13:
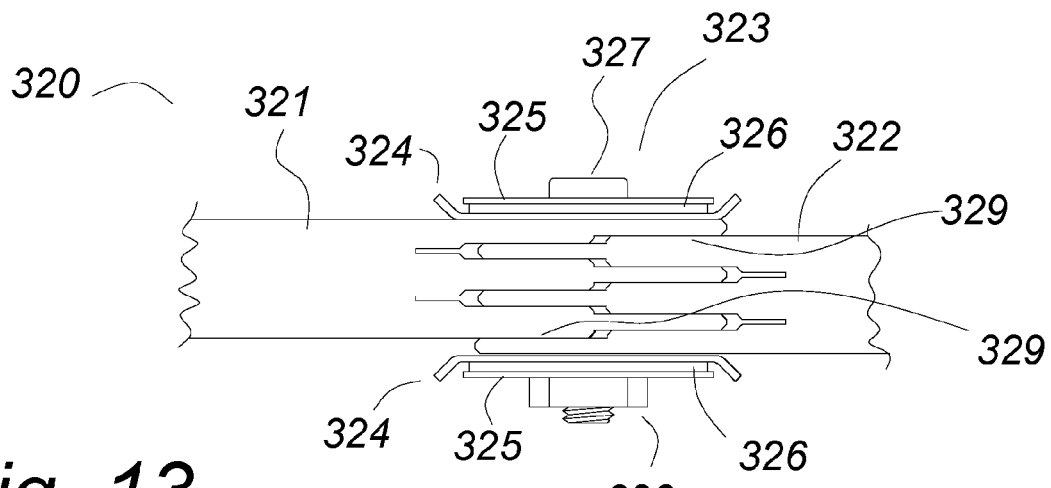
FIG. 13 shows a section through two circuit boards which are connected in the manner of FIG. 12. A clamp ensures a tight connection.

FIG. 13 shows a multilayer printed connector 320 for connecting first and second printed wiring boards 321 and 322. There are ten surfaces 329—329 within the connector 321 where the internal layers of the multilayer printed wiring boards 321 and 322 may make direct metal-to-metal contact. To ensure a good electrical connection, a means for clamping may clamp the boards tightly in the area of the connector 320. As an example, not a limitation, two plates 324, 324 may be held in tight contact with the printed wiring boards 321 and 322 by a bolt 327 and nut 328. To distribute the clamping pressure more evenly, the clamp may further comprise top plates 325, 325 with resilient pads 326, 326 under them. The bolt 327 and the nut 328 are preferably captive, and may be restrained by having a through hole in one of the circuit boards and a complementary notch in the other, as an example, not a limitation.

Figure 14:
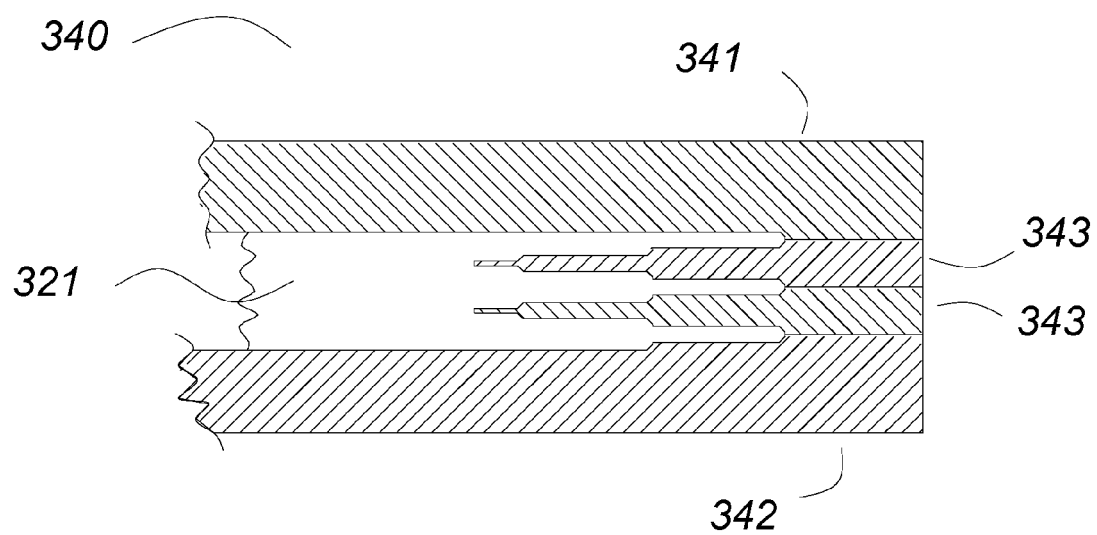
FIG. 14 shows that the circuit boards used for making connections as in FIG. 13 must be precisely assembled when they are bonded and cured.

The multilayer printed wiring board 321 having the printed wiring connector must be fairly precise. Accordingly, FIG. 14 shows that a fixture 340 comprising top and bottom plates may be used to compress and heat the printed wiring board 321 for bonding, and precision inserts 343, 343 may be inserted into the connector area to ensure the correct spacing. Preferably the precision inserts 343, 343 also provide a sealing function to minimize creepage of the prepreg onto the conductive surfaces.

Usually annealed copper is used for printed wiring board foils. However it is necessary that the edges of the connector have good mechanical integrity so that a good fit is ensured even if they are handled roughly. Accordingly, it may be desirable to fabricate the printed wiring board with a harder temper copper or even a harder material. Harder materials tend to have a higher resistivity, but that may not be important for this application. Because this connection is contemplated for use with a power supply having very fast current transients, high frequency effects must be taken into account, particularly the penetration depth. To get very low impedance for the high frequency components of the current transient, the conductors must have a very wide surface area, because the penetration of the current into the metal is very small at very high frequencies. Therefore the total area of the metal for dc currents will be more than adequate, and some slight increase in resistivity will be tolerable. The higher resistivity is not detrimental to the high frequency component, as a higher resistivity increases the penetration depth proportionally.

The use of a harder metal foil would also permit the outer layer of the connector to be unreinforced metal extended from the outer layer of the printed wiring board with no insulated substrate. The multilayer printed wiring board is a stack of laminate, foil, substrates, prepreg, and there is no reason that bare foil should not be used as well. It could be used internally for a full width connection, and it can be used as the outer layers and etched and plated after stacking and bonding, perhaps after the vias are drilled and plated, as illustrations, not limitations.

Figure 15:
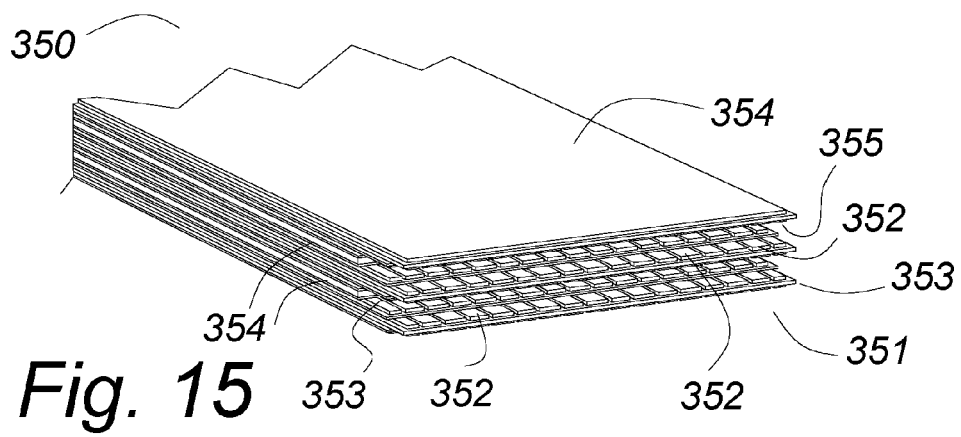
FIGS. 15 through 17 show that the layers of a circuit board may be etched to make interdigitated connections.
Figure 16:
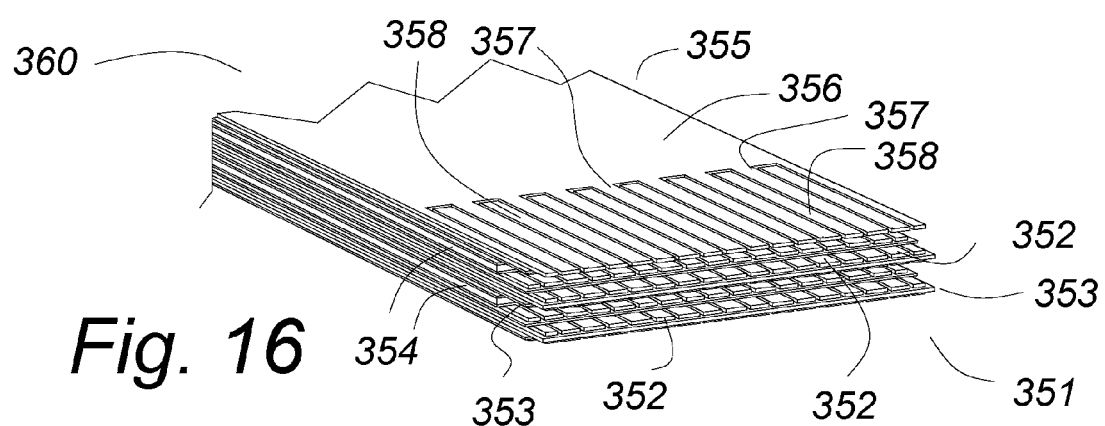
Figure 17:
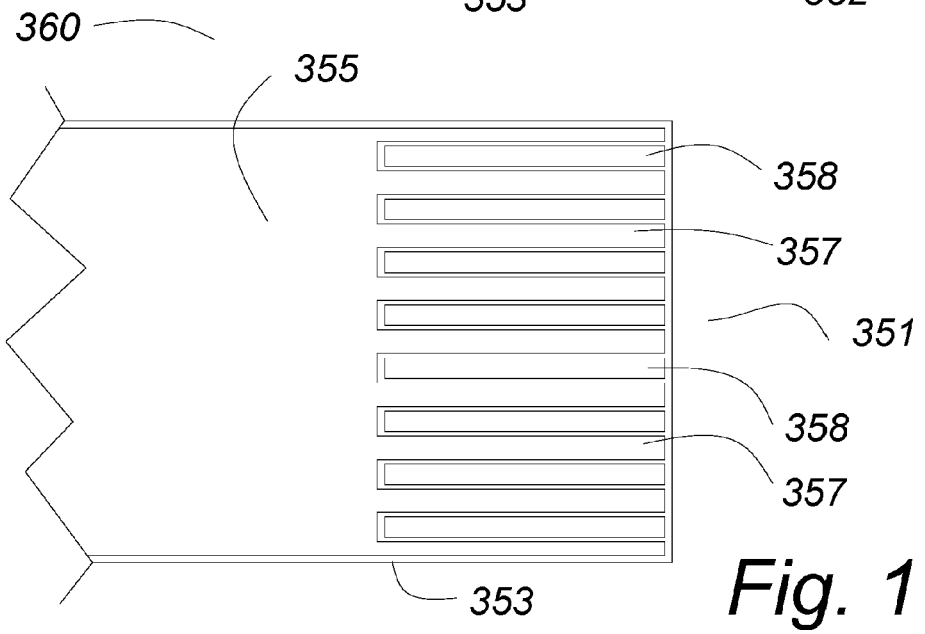

FIGS. 15 through 17 show how to adapt the teachings of FIG. 7 to a multilayer printed connector. A representative finished printed wiring board 350 is shown in FIG. 15. For clarity, the same board is shown without its outer layers as a subassembly 360 in FIGS. 16 and 17, for illustration, not as its preferred finished construction.

Because the contemplated application is for a low voltage, high current power supply with very fast rates of change in the current, the bus for delivering the power is optimized for low inductance and reasonably low resistance at very high frequencies despite the penetration depth limitations. Accordingly, the basic structure of FIG. 12 is chosen, ten layers for the power bus configured as five pairs of interleaved power planes and returns. However, to terminate the output capacitor on separate connector pins, all of the layers are printed with an interdigitated pattern. Extensions of a power plane 355 are interdigitated with shorter conductors for the output capacitor, which is contemplated to be a large array of small capacitors to minimize its equivalent series inductance (esl). In a connector 351, the power contacts 357—357 are brought to the edge of the printed wiring board 350, each being a stack of ten layers, five power contacts interleaved with five returns. The capacitor contacts 358—358 are shorter and do not connect to the rest of the circuit within the printed wiring card 350. Each of the capacitor contacts 358—358 is also a stack of ten layers, five power contacts interleaved with five returns. This implements the design concept of the connector 234 of FIG. 7, as an example.

In this specification and the claims, "print", "printed" or "printing" refer to the well known processes for making printed wiring boards. A "metal contact" may be printed on an extended exposed metal surface of a metal foil layer of a multilayer printed wiring board as by etching, plating or depositing metal using the normal processes of making multilayer printed wiring boards. Extended exposed metal contacts of a first connector on a first multilayer printed wiring board are defined as being complimentary with respective extended exposed metal contacts of a second connector on a second wiring board if, when the connectors are connected, the respective extended exposed metal contacts make face-to-face, metal-to-metal contact so that an electrical connection is established. It is understood that the respective extended exposed metal contacts are insulated from other extended exposed metal contacts by the insulating laminate and by the manner in which they are printed with spaces between adjacent metal contacts.

Figure 18:
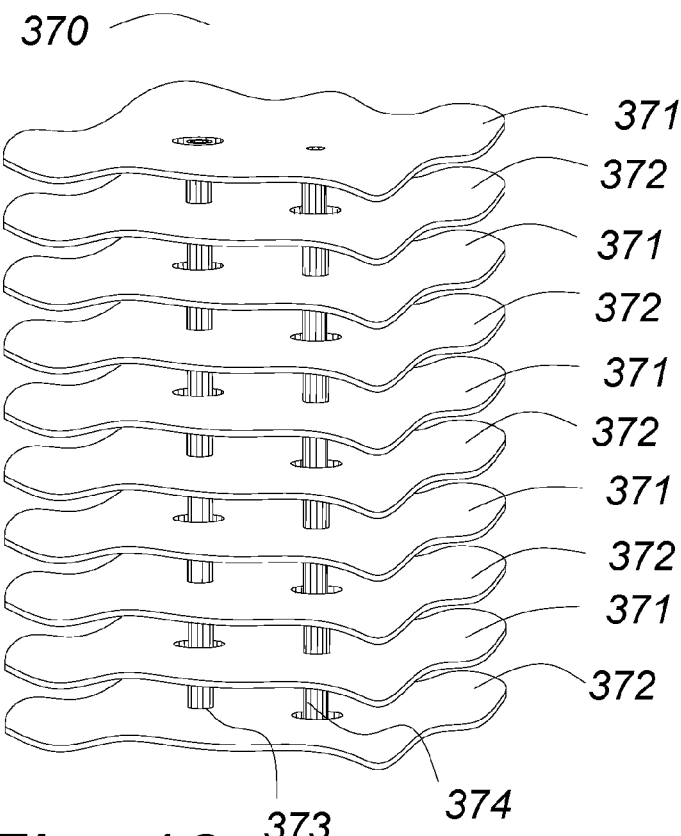
FIG. 18 shows representative vias interconnecting layers of a multilayer circuit board.

FIG. 18 shows another problem with very high frequency currents. FIG. 18 shows a stack of interleaved wide conductors 371—371 and 372—372 in a multilayer printed circuit board, with vias 373 and 374 to interconnect them, the via 373 connecting the layers 372—372 and the via 374 connecting the layers 371—371. It is contemplated that the source of power is components placed on the surface of the printed wiring board, and it is desired to distribute the power throughout the layers. Although two vias are shown, it is contemplated that there would be a large number of them.

The penetration depth presents a significant problem, as the very high frequency components of the current cannot pass through the thickness of the metal. Nor can high frequency currents pass through the bore of the via. The very high frequency current will have to travel over the surface of the foil, over its edge and back along the bottom surface to the via. Then it can travel down the outside surface to the next layer, but again it cannot penetrate the foil, so once again it is forced to follow a surface path. A dense array of vias, as is sometimes used for high currents, will not be very effective, as the very high frequency current will not penetrate very well to the central vias.

Figure 19:
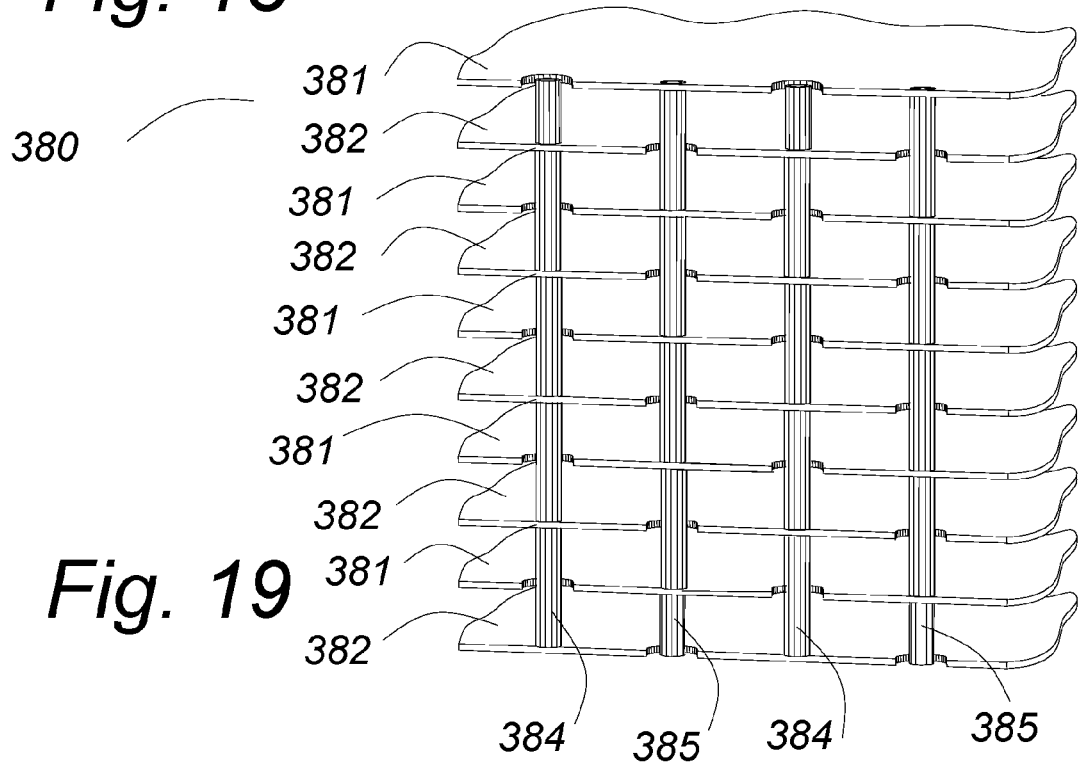
FIG. 19 shows that it is preferred to have vias that interconnect layers of a multilayer circuit board on the edge of a stack of conductors.

FIG. 19 shows that it is preferred to place the vias 384—384 and 385—385 at the periphery of the metal foil layers 381—381 and 382—382. Accordingly, it is preferred to layout the printed wiring card so that there are long edges for the conductors so that vias can be placed there.

Figure 20:
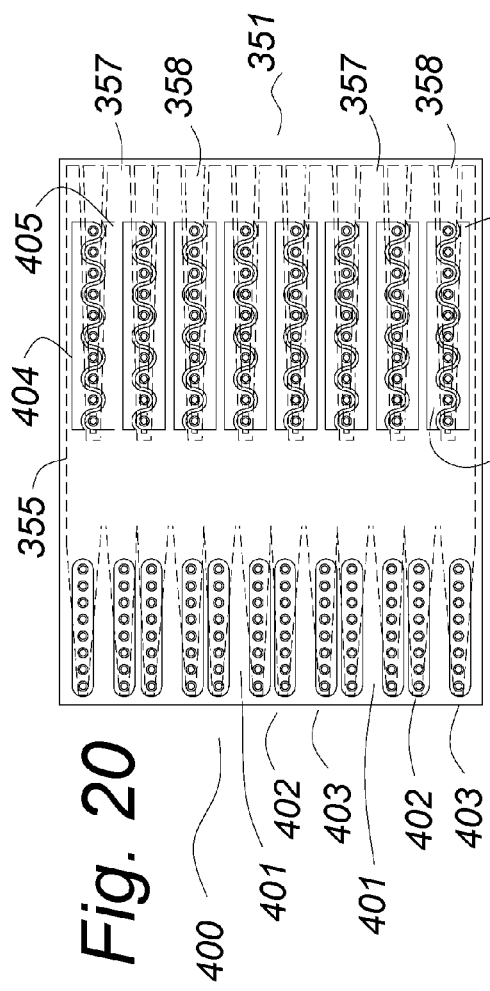
FIG. 20 shows a representative circuit board having a connection system of this invention.
Figure 21:
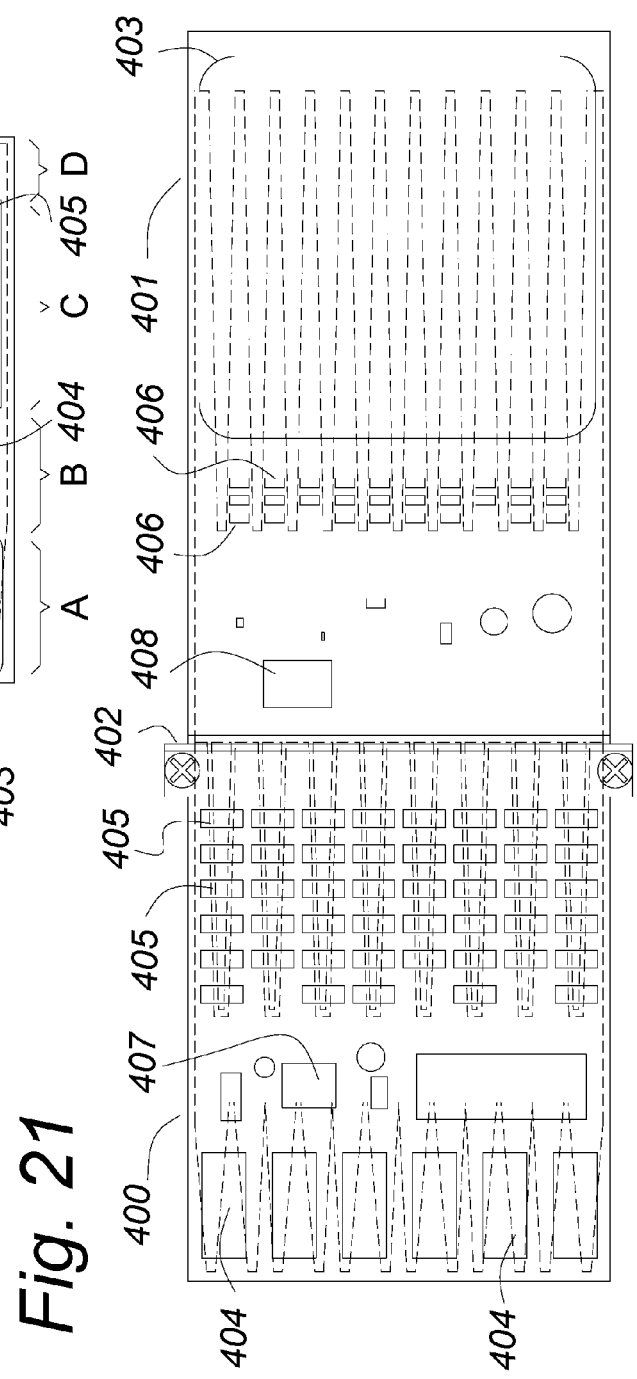
FIG. 21 shows the circuit board of FIG. 20 with representative components mounted thereon and connected to a representative load circuit board.

FIG. 20 shows a representative multilayer printed wiring circuit 400 of this invention for a power supply. FIG. 21 shows the printed wiring circuit 400 with components thereon connected to a load circuit 401.

The dashed line shows the location of a multilayer interleaved power bus 355 that terminates in power contacts 357—357 in the connector 351. In the region designated "A", a surface layout is provided for mounting power components, contemplated as being modules mounted on the top and bottom of the circuit board, 404—404 in FIG. 21. The power buss 355 is digitated through all layers to provide peripheral contacts for a plurality of vias 402—402 to half of the layers comprising power conductors and a plurality of vias 403—403 to the other half of the layers comprising return conductors.

In as much as the current may not be equal in the various modules 404—404, in a region "B" the multilayer interleaved power bus 355 spans the entire circuit board so that the current can spread evenly across the circuit board.

The region "B" can also be used for mounting components, perhaps for monitoring and control. A region "C" is where the output capacitors 405—405 are mounted on interdigitated stacks of interleaved conductors. The region "D" is the connector, and it may be clamped with a clamp 402.

On the load card 401, at the connector, once again all layers span the entire width of the printed circuit, and it is here that the output capacitor is connected to the power supply output. The surface layers in this region may also be used for components 408. The load is shown as a microprocessor 403, as an example, not a limitation, and the load may have a plurality of decoupling capacitors 406—406. Note that the power buss is once again highly digitated under the decoupling capacitors 406—406 and the processor 403, so that the vias may interconnect the multiple layers on their periphery. The digitations also provide spaces within which the other connections of the processor may be run and terminated.

What is claimed is:

1. A connection system for connecting a power supply to a load,
the connection system comprising a first connector and a second connector, the first and second connectors comprising a plurality of complimentary electrical contacts making a plurality of electrical connections through the connection system,
the first connector being on the power supply and the second connector being on the load,
the power supply comprising a power converter having at least a positive output termination and at least a negative output termination,
the power supply further comprising an output capacitor, the output capacitor having at least a positive output capacitor termination and at least a negative output capacitor termination,
the load having at least a positive load termination and at least a negative load termination,
the positive output termination of the power converter being connected to at least a first electrical connection of the plurality of electrical connections through the connection system,
the at least a first electrical connection of the plurality of electrical connections through the connection system being connected to the positive load termination of the load,
the positive output capacitor termination of the output capacitor being connected to at least a second electrical connection of the plurality of electrical connections through the connection system,
the at least a second electrical connection of the plurality of electrical connections through the connection system being connected to the positive load termination of the load,
the negative output termination of the power converter and the negative output capacitor termination of the output capacitor being connected to at least a third electrical connection of the plurality of electrical connections through the connection system, and
the at least a third electrical connection of the plurality of electrical connections through the connection system being connected to the negative load termination of the load.

2. A connection system for connecting a power supply to a load,
the connection system comprising a first connector and a second connector, the first and second connectors comprising a plurality of complimentary electrical contacts making a plurality of electrical connections through the connection system,
the first connector being on the power supply and the second connector being on the load,
the power supply comprising a power converter having at least a positive output termination and at least a negative output termination,
the power supply further comprising an output capacitor, the output capacitor having at least a positive output capacitor termination and at least a negative output capacitor termination,
the load having at least a positive load termination and at least a negative load termination,
the positive output termination of the power converter being connected to at least a first electrical connection of the plurality of electrical connections through the connection system,
the at least a first electrical connection of the plurality of electrical connections through the connection system being connected to the positive load termination of the load,
the positive output capacitor termination of the output capacitor being connected to at least a second electrical connection of the plurality of electrical connections through the connection system,
the at least a second electrical connection of the plurality of electrical connections through the connection system being connected to the positive load termination of the load,
the negative output termination of the power converter being connected to at least a third electrical connection of the plurality of electrical connections through the connection system,
the at least a third electrical connection of the plurality of electrical connections through the connection system being connected to the negative load termination of the load, the negative output capacitor termination of the output capacitor being connected to at least a fourth electrical connection of the plurality of electrical connections through the connection system, and the at least a fourth electrical connection of the plurality of electrical connections through the connection system being connected to the negative load termination of the load.

3. The connection system of claim 2 wherein the positive output termination of the power converter and the negative output termination of the power converter are connected respectively to the first and to the third electrical connections of the plurality of electrical connections through the connection system through respective alternate layers of a first multilayer interleaved power bus.

4. The connection system of claim 3 wherein the positive output capacitor termination and the negative output capacitor termination are connected respectively to the second and to the fourth electrical connections of the plurality of electrical connection through the connection system through respective alternate layers of a second multilayer interleaved power bus.

5. The connection system of claim 4 wherein the first multilayer interleaved power bus and the second multilayer interleaved power bus are interdigitated.

6. The connection system of claim 2 wherein the first connector comprises a plurality of exposed extended metal surfaces which are extensions respectively of the respective layers of the first multilayer interleaved power bus.

7. The connection system of claim 4 wherein the first connector comprises a plurality of exposed extended metal surfaces which are respectively extensions respectively of the respective layers of the first multilayer interleaved power bus and the second multilayer interleaved power bus.

8. The connection system of claim 2 wherein the positive output termination of the power converter and the negative output termination of the power converter are connected respectively to the respective alternate layers of a first multilayer interleaved power bus through a plurality of vias which are located on the periphery of the respective alternate layers of a first multilayer interleaved power bus.

9. The connection system of claim 5 wherein the positive output termination of the power converter and the negative output termination of the power converter are connected respectively to the respective alternate layers of a first multilayer interleaved power bus through a first plurality of vias which are located on the periphery of the respective alternate layers of the first multilayer interleaved power bus, and the positive output capacitor termination of the output capacitor and the negative output capacitor termination of the output capacitor are connected respectively to the respective alternate layers of the second multilayer interleaved power bus through a second plurality of vias which are located on the periphery of the respective alternate layers of the second multilayer interleaved power bus.

* * * * *